United States Patent [19]

Bachmeier

[11] 3,723,832

[45] Mar. 27, 1973

[54] ZENER DIODE AND METHOD OF PRODUCING SUCH A ZENER DIODE

[75] Inventor: Alfred Bachmeier, 8265 Simbach, Germany

[73] Assignee: Licentia, Patent-Verwaltungs-G.m.b.H., Frankfurt am Main, Germany

[22] Filed: May 27, 1971

[21] Appl. No.: 147,537

[30] Foreign Application Priority Data

June 1, 1970 Germany..................P 20 26 683.5
June 1, 1970 Germany..................P 70 20 323.5

[52] U.S. Cl........317/234 R, 317/235 T, 317/235 AQ
[51] Int. Cl...........................................H011 9/00
[58] Field of Search....................317/235 T, 235 AQ

[56] References Cited

UNITED STATES PATENTS

| | | | |
|---|---|---|---|
| 3,497,776 | 2/1970 | Philips | 317/234 |
| 3,612,959 | 10/1971 | Simon | 317/235 R |

OTHER PUBLICATIONS

Sah, et al., Applied Physics Letters, Vol. 12, No. 4 15 Feb. 1968.

*Primary Examiner*—Martin H. Edlow
*Attorney*—Spencer & Kaye

[57] ABSTRACT

A Zener diode having a semiconductor body with recombination centers therein in the region of the P-N junction. The invention also includes a method of producing such a diode.

3 Claims, 4 Drawing Figures

Patented March 27, 1973

3,723,832

2 Sheets-Sheet 1

Inventor:
Alfred Bachmeier

BY Spencer & Kaye
ATTORNEYS

Patented March 27, 1973 3,723,832

2 Sheets-Sheet 2

Inventor:
Alfred Bachmeier

BY Spencer & Kaye
ATTORNEYS.

ZENER DIODE AND METHOD OF PRODUCING SUCH A ZENER DIODE

BACKGROUND OF THE INVENTION

The invention relates to a Zener diode and to a method of producing such a Zener diode.

In the art of semiconductors it is known to improve the switching properties of switching diodes by the introduction of recombination center promoting constituents, such as gold, into the semiconductor body. In this manner, as is known, the switching diodes become "faster".

SUMMARY OF THE INVENTION

According to the invention, there is provided a Zener diode having a breakthrough voltage between 5 and 30 volts and comprising a semiconductor body of a first conductivity type, a region of a second conductivity type introduced into said semiconductor body, a P-N junction formed between said region and the remaining portion of said semiconductor body, and recombination centers in said semiconductor body in the region of the P-N junction.

Further according to the invention, there is provided a method of producing such a Zener diode comprising the steps of introducing a region of a second conductivity type into a semiconductor body of a first conductivity type to form a P-N junction therein and introducing into said semiconductor body recombination center promoting constituents.

BRIEF DESCRIPTION OF THE DRAWINGS

The invention will now be described, by way of example, with reference to the accompanying drawings, in which.

DESCRIPTION OF THE PREFERRED EMBODIMENTS

The invention is based upon recognition of the fact that in addition to improving the switching properties of conventional switching diodes by the production of recombination centers in the semiconductor body thereof, it is also possible by this means to improve the course of the characteristic curve in the breakthrough region of a Zener diode, which is a quite different type of diode from a conventional switching diode and which, as is known, is intended for a quite different purpose than a switching diode and is also operated differently. Therefore according to the invention, in a Zener diode it is proposed that the semiconductor body be provided with recombination centers. The important point here is that the recombination centers be present in the region of the P-N junction of the Zener diode.

The requisite recombination centers in the semiconductor body of the Zener diode are obtained, for example, by the introduction of recombination center promoting constituents, such as, for example, gold or copper. The introduction of recombination center promoting constituents in the semiconductor body for the production of recombination centers is effected, for example, by diffusion of the recombination center promoting constituents into the semiconductor body.

The improvement of the characteristic curve of a Zener diode achieved by the invention consists in that in the breakthrough region, in which, as is known, a Zener diode is operated, the characteristic curve "-degenerates into noise" to a substantially lesser degree than the characteristic curve of a Zener diode without the feature of the invention, e.g., the recombination centers. The improvement in the respective characteristic curves appears clearly from a comparison of the characteristic curves of FIGS. 1 and 2. While the characteristic curve of FIG. 2, which pertains to a Zener diode without recombination centers, is markedly degenerated into noise in the breakthrough region, the characteristic curve of FIG. 1 which pertains to a Zener diode which possesses the feature of the invention, namely recombination centers in the semiconductor body, is not degenerated into noise, but rather follows a relatively smooth curve. The recombination centers producing the improvement are produced, for example, as indicated above, by the introduction of recombination center promoting constituents, such as gold, into the semiconductor body of the Zener diode.

As is known, Zener diodes are semiconductor diodes which must break through at a quite specific and precisely defined voltage. The breakthrough voltage becomes the more definite, the less the characteristic curve is "degenerated into noise" in the breakthrough region. On the other hand, switching diodes are semiconductor diodes where the important point is that the recombination centers introduced into the semiconductor body lead to a rapid breakdown of the stored charge in switching over from the forward direction to the reverse direction.

Figure 3:
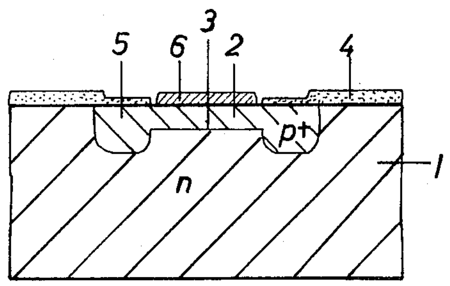
FIG. 3 is a sectional view of a known Zener diode.

FIG. 3 shows a Zener diode which does not yet possess the feature of the invention, i.e., no recombination center promoting constituents have yet been introduced into the semiconductor body. The Zener diode according to FIG. 3 consists of a semiconductor body 1 of a specific first type of conductivity into which a semiconductor region 2 of the opposite type of conductivity is introduced in a known manner, e.g., by diffusion. At the limit surface between the semiconductor body 1 and the semiconductor region 2 a P-N junction 3 occurs which is necessary for the functioning of the Zener diode.

The Zener diode according to FIG. 3 is particularly a planar diode having an insulating coating 4 on the semiconductor surface. In order to prevent the occurrence of a breakthrough in the surface region of the P-N junction, the semiconductor region 2 is surrounded by a protective annular region or zone 5 which ensures that the breakthrough takes place in the interior of the semiconductor body. Contact to the semiconductor region 2 is effected by an electrode 6.

Figure 4:
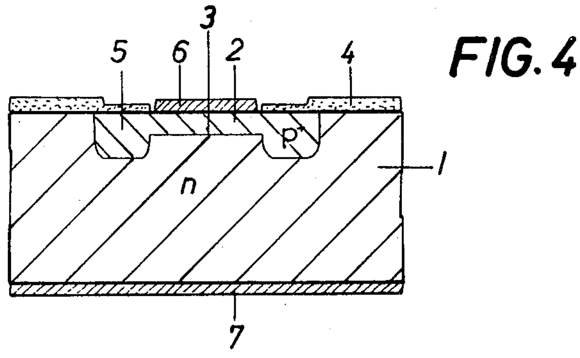
FIG. 4 is a view similar to FIG. 3, but showing a Zener diode in accordance with the invention.

To improve the characteristic curve of the Zener diode according to FIG. 3, in accordance with the invention as shown in FIG. 4 recombination center promoting constituents are introduced into the semiconductor body 1. For example, a coating 7 of gold is applied on the semiconductor body 1 and a part of the gold layer 7 is subsequently diffused into the semiconductor body 1. When using a semiconductor body of silicon, the diffusion takes place, for example, at a temperature of 900°C. The duration of diffusion in this case amounts, for example, to 30 minutes.

Figure 1:
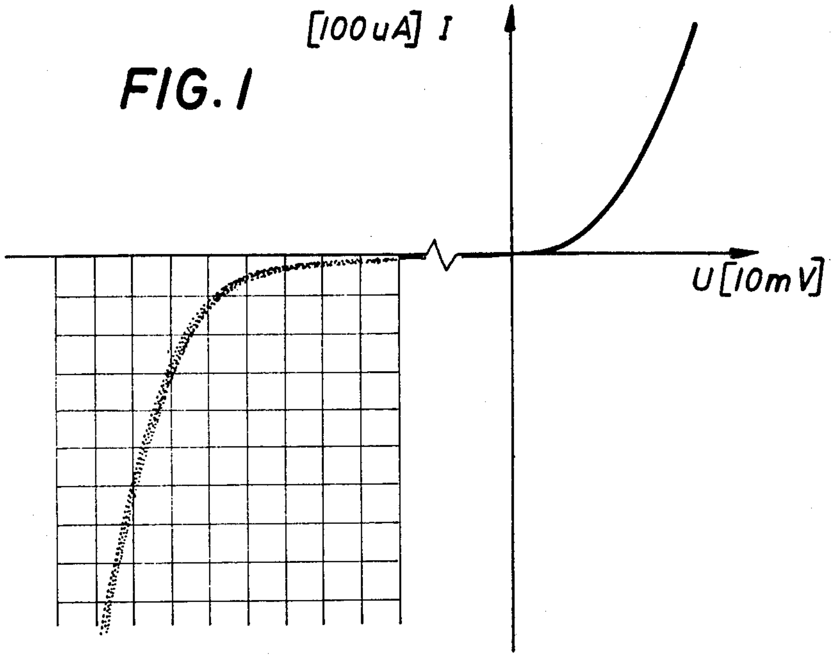
FIG. 1 illustrates a typical characteristic curve of a normal Zener diode.
Figure 2:
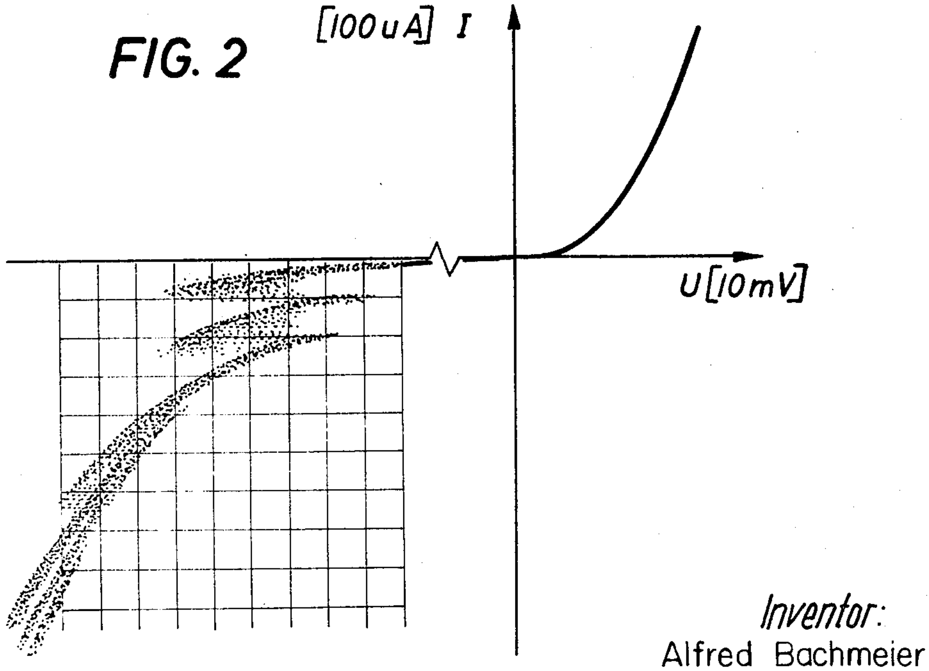
FIG. 2 illustrates a typical characteristic curve of a Zener diode in accordance with the invention.

The Zener diode produced in accordance with the invention displays a breakthrough characteristic curve such as is represented by way of example in FIG. 1. Due to the introduction of recombination centers, practically all characteristic curve distortions, which a Zener diode without the formation of recombination centers according to the invention possesses as shown in FIG. 2, have disappeared. The breakthrough currents lie, for example, between 10 and 1,000 $\mu$A and the breakthrough voltages, for example, between 5 and 30 volts.

The effect achieved by the invention without doubt is surprising, since on the basis of the prior art in switching diodes it was in no way forseeable that by the production of recombination centers in the semiconductor body the characteristic curve of a Zener diode in the breakthrough region can be improved so decisively.

It will be understood that the above description of the present invention is susceptible to various modifications, changes and adaptations.

What is claimed is:

1. In a Zener diode having a breakthrough voltage between 5 and 30 volts and including a semiconductor body of a first conductivity type, a region of a second conductivity type introduced into said semiconductor body, and a P-N junction formed between said region and the remaining portion of said semiconductor body, the improvement comprising recombination center means in said semiconductor body in the region of said P-N junction for producing a relatively smooth I-V characteristic curve in the region of the breakthrough voltage wherein the degeneration of said curve into noise is reduced.

2. A Zener diode as defined in claim 1 wherein said recombination center means is gold.

3. A Zener diode as defined in claim 1 wherein said recombination center means is copper.

* * * * *